United States Patent [19]

Bosnyak

[11] Patent Number: 5,068,551
[45] Date of Patent: Nov. 26, 1991

[54] APPARATUS AND METHOD FOR TRANSLATING ECL SIGNALS TO CMOS SIGNALS

[75] Inventor: Robert J. Bosnyak, Tacoma, Wash.

[73] Assignee: National Semiconductor Corporation, Santa Clara, Calif.

[21] Appl. No.: 586,068

[22] Filed: Sep. 21, 1990

[51] Int. Cl.[5] .......................................... H03K 19/0175
[52] U.S. Cl. ...................................... 307/475; 307/455
[58] Field of Search ................. 307/475, 455, 443, 356

[56] References Cited

U.S. PATENT DOCUMENTS

| | | | |
|---|---|---|---|
| 4,437,171 | 3/1984 | Hudson et al. | 307/475 |
| 4,748,346 | 5/1988 | Emori | 307/443 |
| 4,755,693 | 7/1988 | Suzuki et al. | 307/443 |
| 4,806,799 | 2/1989 | Pelley, III et al. | 307/455 |
| 4,864,159 | 9/1989 | Cornelissen | 307/475 |

OTHER PUBLICATIONS

An 8-ns 1 Mbit ECL BICMOS SRAM with Double Latch . . . , IEEE Journal of Solid State Circuits, vol. 24, #5, Oct. 1989, Matsui et al.

Primary Examiner—David Hudspeth
Assistant Examiner—Andrew Sanders
Attorney, Agent, or Firm—James W. Rose

[57] ABSTRACT

The present invention provides an ECL to CMOS level translation circuit which uses a dynamic, internally generated reference voltage to translate ECL level signals into CMOS level signals. The translator includes an input translation circuit which uses emitter-follower bipolar transistors for receiving and interpreting the ECL level signals and to generate the dynamic, internally generated reference potential, and an output circuit for outputting the CMOS signals.

10 Claims, 5 Drawing Sheets

APPARATUS AND METHOD FOR TRANSLATING ECL SIGNALS TO CMOS SIGNALS

BACKGROUND OF THE INVENTION

1. Field of the Invention

The present invention relates to an emitter coupled logic (ECL) to complementary metal oxide semiconductor (CMOS) translator, and more particularly, to an improved high speed, ECL to CMOS translator which uses a dynamic internally generated reference potential.

2. Description of the Prior Art

With the advent of BiCMOS technology, which combines the advantages of both bipolar and CMOS technologies on a single semiconductor integrated circuit (IC), ECL to CMOS translators are required to translate signals from ECL logic levels to CMOS logic levels. For example, an ECL to CMOS translator may be used to translate complementary signals at ECL logic levels to complementary signals at corresponding CMOS logic levels.

ECL circuits operate between a four and half to a five volt differential and have a logic swing ranging from (−0.8) volts below the upper potential to 2.0 volts above the lower potential. For example, if the voltage differential is set from (−4.5) volts to (0.0) volts, a signal having a potential ranging from (−0.8) volts to (0.0) volts is a logical high, and a signal having a potential ranging from (−4.5) to (−1.6) volts is a logical low.

CMOS circuits also operate between a four and a half to a five volt differential and have a logic swing ranging from 1.5 volts below the upper potential and 1.5 volts above the lower potential. For example, if the voltage differential is set from (−4.5) to (0.0), a signal having a potential ranging from (−1.5) to (0.0) volts is a logical high, and a signal having a potential ranging from (−4.5) to (−3.0) is a logical low.

Referring to FIG. 1, a known ECL to CMOS translator circuit according to the prior art is shown. Translator 10 includes input circuit 12, a reset circuit 14, and complementary output circuits 16 and 17. The translator 10 is coupled between ECL logic circuit 18 and CMOS logic circuit 20.

Two emitter-follower transistors 26 and 28 are used to supply the complementary ECL output signals from ECL circuit 18 to nodes B and A respectively at the input of input circuit 12. The first emitter-follower transistor 26 has its base coupled to ECL circuit output node 24, its collector coupled to $V_{cc}$, and its emitter coupled to node B. The second emitter-follower transistor 28 has its base coupled to ECL circuit output 22, its collector coupled to $V_{cc}$, and its emitter coupled to node A. $V_{cc}$ equals the highest supply voltage of the circuit, which in this example, equals (0.0) volts.

Translation input circuit 12 includes a first enhancement P channel transistor M1 and a second enhancement P channel transistor M2. Transistor M1 has its source (S) coupled to node A, and its drain (D) coupled to node C. Transistor M2 has its source (S) coupled to node B, and its drain (D) coupled to node D. The gates of transistors M1 and M2 are coupled to the common voltage reference $V_{ref}$ generated by external voltage reference circuit 30.

Reset circuit 14 includes a first N channel enhancement transistor M3, a second N channel enhancement transistor M4, a third N channel enhancement transistor M5 and a fourth N channel enhancement transistor M6. M3 has its drain (D) coupled to node C, its gate coupled to node B, and its source (S) coupled to node E. M4 has its drain (D) coupled to node D, its gate coupled to node A, and its source (S) coupled to node F. M5 has its drain (D) coupled to node E, its gate coupled to node D, and its source (S) coupled to ground. M6 has its drain (D) coupled to node E, its gate coupled to node D, and its source (S) connected to ground.

Output circuits 16 and 17 are well known CMOS inverters operating between the CMOS logic range of $V_{cc}$ and ground. Output circuit 16 includes a P channel enhancement transistor M7 and an N channel enhancement transistor M8. Transistor M7 has its source (S) coupled to $V_{cc}$, its gate coupled to node C, and its drain coupled to $V_{out}$. Transistor M8 has its drain (D) coupled to $V_{out}$, its gate coupled to node C and its source (S) coupled to ground. Output circuit 17 includes a P channel enhancement transistor M22 and an N channel enhancement transistor M23 arranged in the identical manner as output translation circuit 16.

Referring to FIG. 2, a timing diagram illustrating the ECL to CMOS translation operation of the circuit shown in FIG. 1 is shown. The diagram is divided into three sections. In the first section (I), the switching operation of the ECL nodes A and B between (0.8 to −2.0) volts is shown. In the second section (II), the switching operation of nodes C and D between (−1.0 and −4.5) volts is shown. In section (III), the switching operation between the full CMOS logic range of (−4.5 to 0.0) volts at Vout and [Vout] is shown.

During operation of translator 10, ECL logic circuit 18 generates complementary ECL signals at nodes 22 and 2 respectively. The ECL signals are used to drive emitter-follower-transistors 26 and 28, which in turn are used to provide low impedance ECL level signals at nodes B and A respectively. For example, if a high ECL signal is presented at node 24, emitter-follower transistor 26 generates a high ECL signal at its emitter and node B is pulled up to A VOH of −VBE (−0.8 volts) The complementary low ECL signal at node 22 drives emitter-follower transistor 28 and node A to A VOL (−2.0 volts) as determined by the gain of the ECL device. The voltage at node A is equal to the voltage at node 22 minus the base-emitter voltage drop of transistor 28. Since ECL logic circuit 18 is approximately (−1.2 volts) and the $V_{BE}$ of transistor 28 is approximately (−0.8 volts).

Conversely, if node 22 is at a high ECL level and node 24 is at a low ECL level, emitter follower transistors 28 and 26 operate to pull node A up to $V_{OH}$ of $V_{BE}$ (−0.8 volts) and node B remains low at (−2.0 volts). The two emitter-follower transistors 26 and 28 dissipate current, as illustrated by the current sources S1, and S2, coupled to the emitters of transistors 26 and 28 respectively.

Translation input circuit 12 is responsible for receiving the complementary ECL signals at nodes A and B, and comparing the potential of the two signals with reference of voltage $V_{ref}$, which is set to a voltage near the middle of the operating range of nodes A and B. Based on the comparison, transistors M1 and M2 are used to control the potential at complementary nodes C and D respectively. Nodes C and D operate at two discrete states, $V_{AAH}$ (−1.0 volts) and $V_{AAL}$ (−4.5 volts). The potential of $V_{AAH}$ is intermediate the full CMOS level.

In the event that the potential at node A is higher than $V_{ref}$ plus a gate threshold ($V_T$), transistor M1 is turned on, and node C is pulled up to $V_{AAH}$. Conversely, in the event the potential at node A is less than $V_{ref}$, transistor M1 is turned off. Similarly, in the event the potential at node B is greater than $V_{ref}$ plus ($V_T$), transistor M2 is turned on and pulls up node D to $V_{AAH}$. In the event the potential signal at node B is less than $V_{ref}$, transistor M2 is turned off Reset circuit 14 is responsible for monitoring the complementary signals presented at nodes C and D, and adjusting potential of nodes C and D as transistors M1 and M2 respectively turn on. For example, in the event transistor M1 is turned on, reset circuit 14 operates to pull down node D to $V_{AAL}$. With nodes B and D at low potentials and coupled to the gates of transistors M3 and M5 respectively, transistors M3 and M5 turn off and node C is pulled up by M1 to $V_{AAH}$. In the event transistor M2 is turned off, transistors M3, M4, M5 and M6 operate in the complement to that described above to reset or pull up node D to $V_{AAH}$.

Output translation circuits 16 and 17 are responsible for receiving the intermediate level ($V_{AAH}$ and $V_{AAL}$) complementary potential signals at nodes C and D respectively, and translating them into complementary signals in the full CMOS logic range.

During operation of translation circuit 16, in the event node C is low at $V_{AAL}$, transistor M7 is turned on and transistor M8 is turned off. As a result, $V_{out}$ equals $V_{cc}$. In the event node C is high, transistor M7 is turned off and transistor M8 is turned on, and as a result, $V_{out}$ equals $V_{ss}$. Output translation circuit 17 operates in the identical manner to produce CMOS output level signals at [$V_{out}$] as node D switches between $V_{AAH}$ and $V_{AAL}$.

The prior art ECL to CMOS translator as described above has a number of deficiencies. First, the generation of $V_{ref}$ requires that a specific circuit, separate from the circuit of translator 10, be designed, laid out and fabricated on the die containing translation circuit 10. The addition of external reference circuit 30 therefore decreases the die surface area available for other circuitry. Reference circuit 30 also increases the number and complexity of processing steps required to fabricate the die, which may significantly decrease the manufacturing yield of a BiCMOS IC containing the prior art ECL to CMOS translator 10.

Another problem associated with prior art translator 10 is the time required for ECL to CMOS translation. Translator 10, with its input, reset and output stages 12, 14, 16 and 17, requires numerous gate delays to complete the ECL to CMOS translation. Generally, the translation time for ECL to CMOS translator 10 of the prior art ranges approximately from 700 to 800 picoseconds, which is relatively slow for many of today's high speed BiCMOS products.

The reference voltage $V_{ref}$ also is responsible for slowing down the translation speed of translator 10. Since $V_{ref}$ is set at approximately in the middle of the CMOS operating range, transistors M1 and M2 require a longer period of time to turn on and off in response to a change of potential at nodes A and B respectively.

Another problem of prior art ECL to CMOS translator 10 is the lack of utilization of the current dissipated by current sources S1 and S2 of emitter-follower transistors 26 and 28.

SUMMARY OF THE INVENTION

The present invention provides an ECL to CMOS level translator which uses a dynamic, internally generated reference potential to translate ECL level signals into CMOS level signals.

The translator includes an input translation circuit for receiving the ECL level signals from two emitter-follower transistors coupled to an ECL circuit. The input translation circuit uses the varying voltage potential on the emitters of the two emitter-follower transistors, as the emitter-follower transistors switch between high and low ECL levels, to generate dynamic reference voltages internal to the input translation circuit. The dynamic reference voltages are used to drive two output circuits which generate complementary output signals. A refresh flip flop circuit is used to complete and maintain the translation at CMOS levels.

The translator of the present invention provides several advantages. First, a circuit external to the translator is not required to generate the reference voltages. All the problems associated with the design and lay out of an external reference circuit are thus eliminated. Second, the current dissipated by the load coupled to the emitter-follower transistors, which is otherwise wasted, is used to generate the dynamic internal reference voltages. Third, the dynamic internally generated voltages are set at an optimal potential depending on the state of the output circuits to help speed up the translation time. Fourth, with a single translator stage having a minimum number of gates, the amount of time required for ECL to CMOS translation is improved.

DETAILED DESCRIPTION OF THE PREFERRED EMBODIMENT

Figure 1:
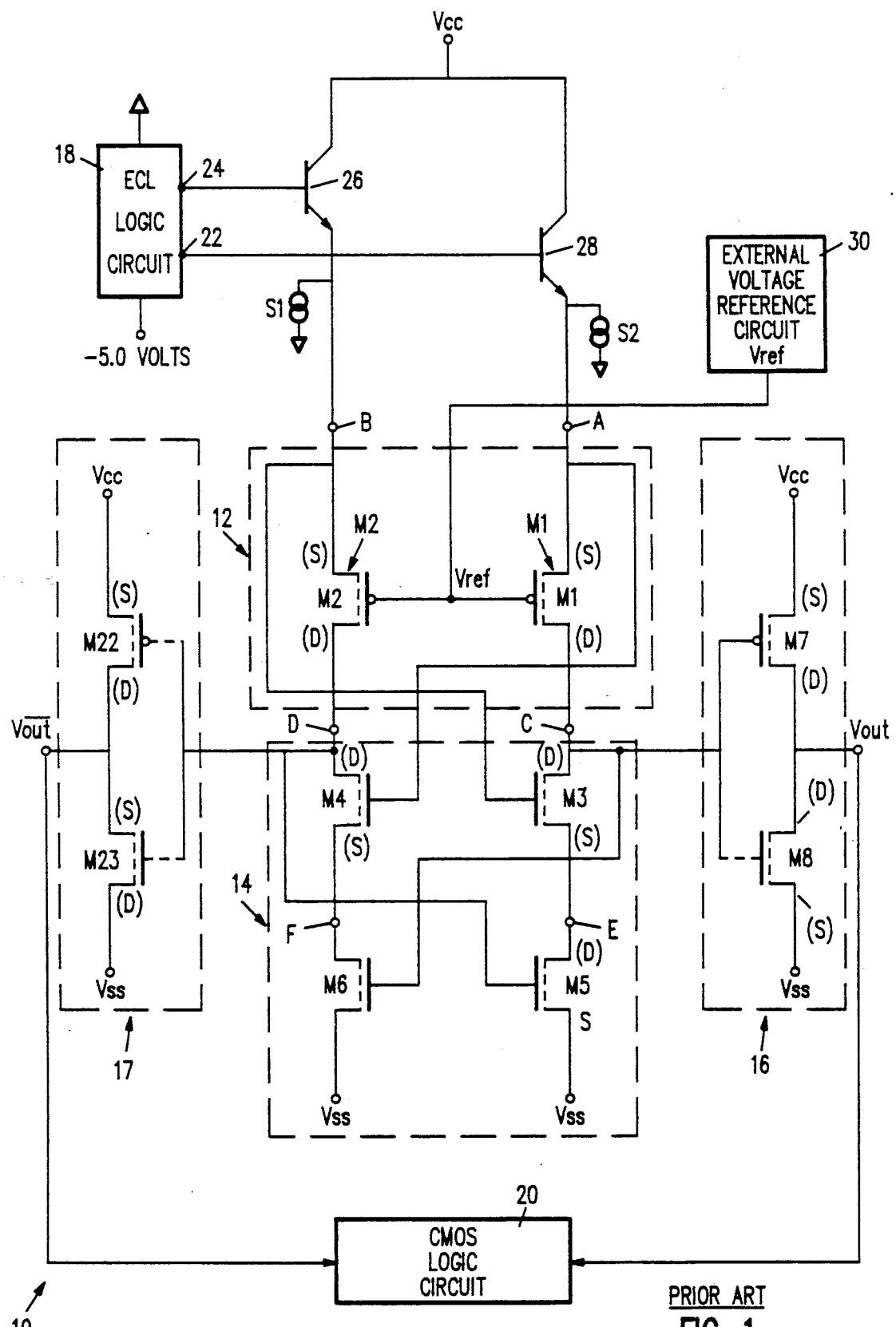
FIG. 1 is an ECL to CMOS translation circuit according to the prior art.
Figure 3:
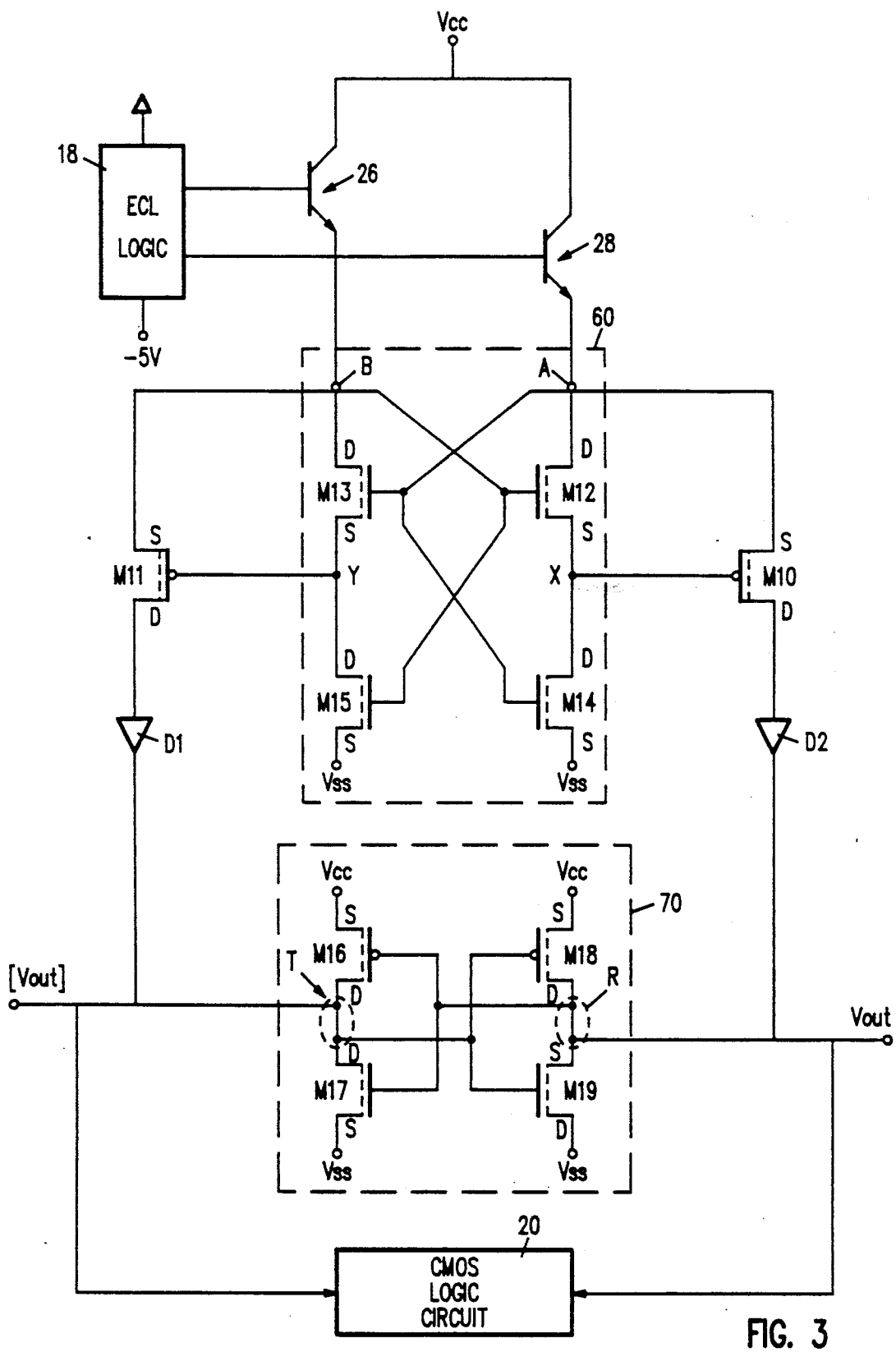
FIG. 3 is an embodiment of an ECL to CMOS translation circuit according to the present invention.
Figure 4:
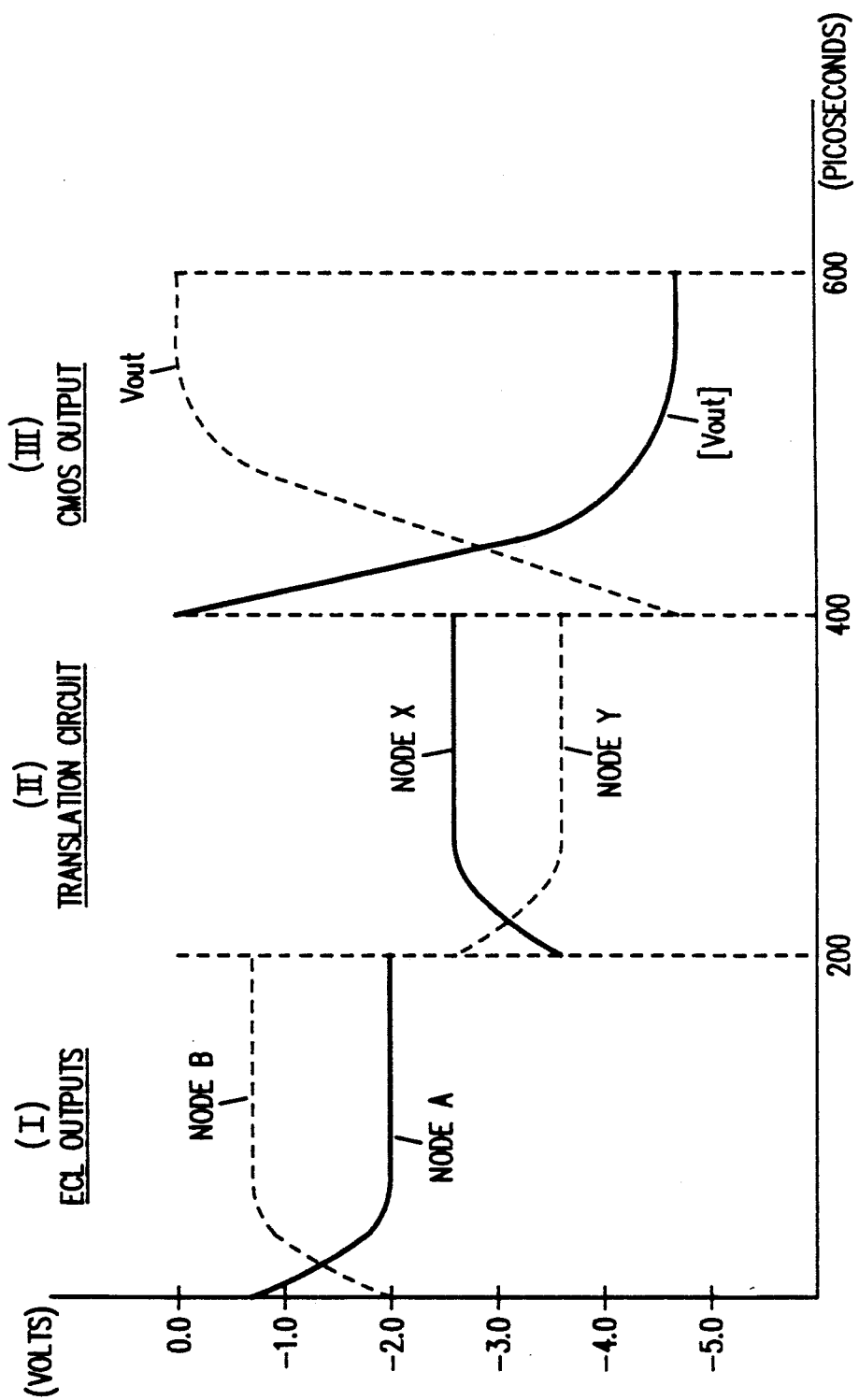
FIG. 4 is a timing diagram of the ECL to CMOS circuit shown in FIG. 2 according to the present invention.

Referring to FIG. 3, an embodiment of an ECL to CMOS translation circuit according to the present invention is shown. The translator 50 includes an input translation circuit 60, and two complementary output transistors M10 and M11 and a refresh circuit 70. The circuit components which perform the same or a similar function as described with reference to FIG. 1 are indicated by the same reference numerals in FIG. 3.

Input translation circuit 60 includes a first enhancement N channel transistor M12, a second enhancement N channel transistor M13, a third enhancement N channel transistor M14, and a fourth enhancement N channel transistor M15. Transistor M12 has its drain (D) coupled to node A, its gate coupled to node B, and its source (S) coupled to node X. Transistor M13 has its drain (D) coupled to node B, its gate coupled to node A, and its source (S) coupled to node Y. Transistor M14 has its drain (D) coupled to node X, its gate coupled to node A, and its source (S) coupled to ground. Transistor M15 has its drain (D) coupled to node Y, its gate coupled to node B and its source (S) coupled to ground.

Refresh circuit 70 includes two basic CMOS inverters 72 and 74. The first CMOS inverter 72 includes a P channel enhancement transistor M16 and an N channel enhancement transistor M17. Transistor M16 has its source (S) coupled to $V_{cc}$, and its drain (D) coupled to node T. Transistor M17 has its drain (D) coupled to node T, and its source (S) coupled to ground. The gates of transistors M16 and M17 are respectively coupled to one another and to node R. The second CMOS inverter 74 includes a P channel enhancement transistor M18 and an N channel enhancement transistor M19. Transistor M18 has its source coupled to $V_{cc}$, and its drain coupled to node R. Transistor M19 has its drain (D) coupled to node R, and its source (S) coupled to ground. The gates of transistors M18 and M19 are respectively coupled to one another and to node T.

Transistors M10 and M11 are P channel enhancement transistors. Transistor M10 has its source (S) couple to node A, its gate coupled to node X, and its drain (D) coupled to the cathode of D2 connects to node R through the anode of diode D2. The cathode of D2 connects to output transistor M11 has its source (S) coupled to node B, its gate coupled to node Y, and its drain (D) coupled to node T through the anode of diode D1.

Operation of ECL to CMOS translator 50 of the present invention is best described using an example. Consider a potential of (−2.0 volts) at node A, and a high ECL potential ($V_{BE}=-0.8$ volts) at node B. The following description explains how translation circuit 50 achieves the desired output of providing a low CMOS level output at node $V_{out}$ and a complementary high CMOS level output signal at node [$V_{out}$].

Figure 2:
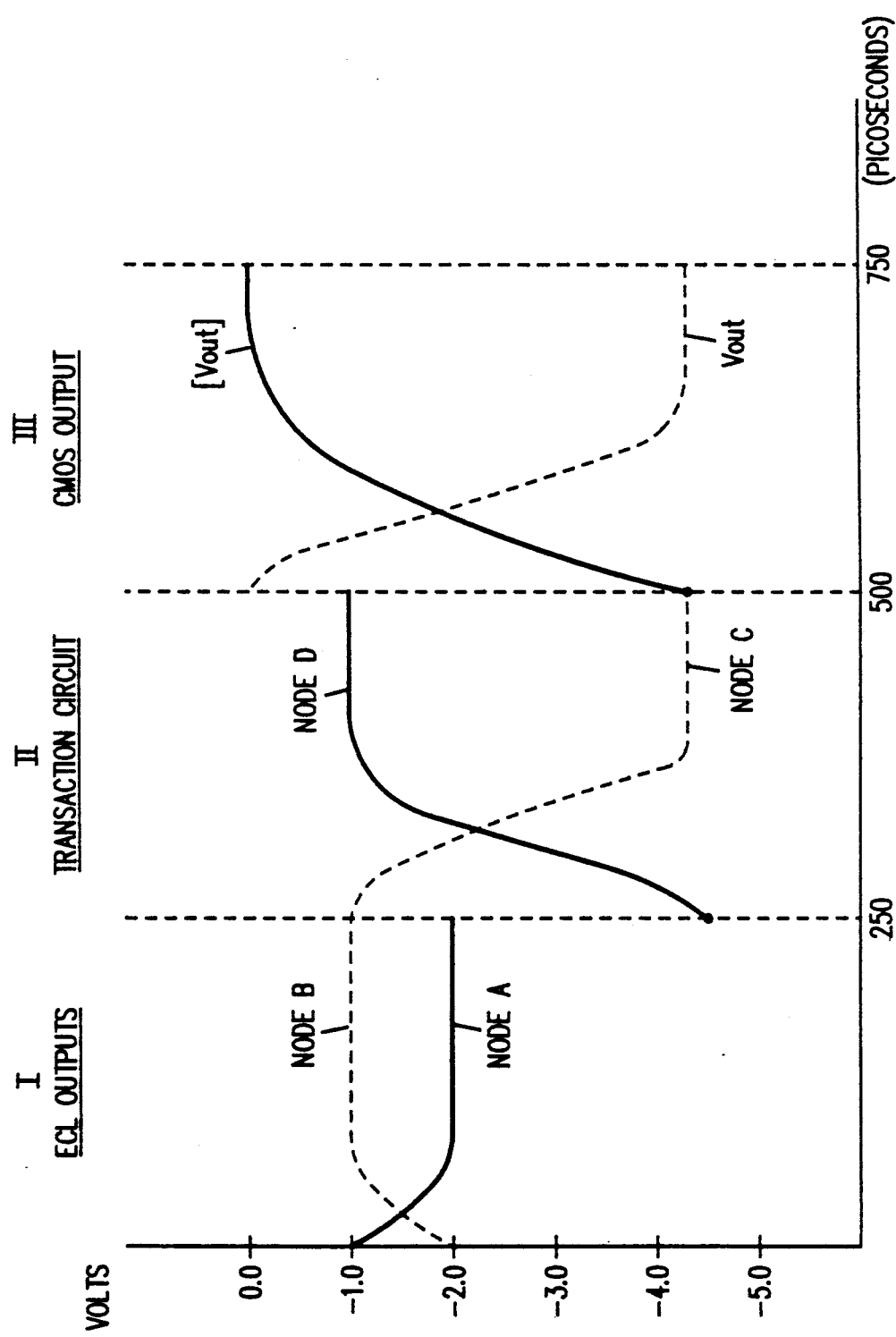
FIG. 2 is a timing diagram of the ECL to CMOS circuit shown in FIG. 1 according to the prior art.

Referring to FIG. 3, a timing diagram illustrating the ECL to CMOS translation operation of the circuit shown in FIG. 2 according to the present invention is shown. The diagram is divided into three sections. In the first section (I), the switching operation of the ECL nodes A and B between (−0.8 to −2.0) volts is shown. In the second section (II), the switching operation of intermediate nodes X and Y between (−3.5 and −2.5 volts) is shown. In the third section (III), the switching operation between the full CMOS logic range of −4.5 to 0.0) volts to $V_{out}$ and [$V_{out}$] is shown.

A high potential ($V_{BE}=-0.8$) at node B, applied to the gates of transistors M12 and M15, establishes a high level of conductance in transistors M12 and M15. A low potential (−2.0 volts) at node A, applied to the gates of transistors M13 and M14, establishes a relatively low level of conductance in transistors M13 and M14 respectively. As a result, node X is pulled up to an intermediate voltage $V_{DDH}$, which is determined by the relatively greater conductance of transistor M12 versus transistor M14. Analogously, node Y is pulled down to an intermediate voltage $V_{DDL}$, which is determined by the relatively greater conductance of transistor M15 versus transistor M13.

In a preferred embodiment, transistors M12 and M13 have a gate length of 1.2 microns and a width of 4.8 microns. Transistors M14 and M15 have a gate length of 1.2 microns and a width of 1.2 microns. Transistors M10 and M11 have a gate length of 1.2 microns and a width of 50 microns. With transistors M12 and M13 having a gate of approximately our times larger than transistors M14 and M15, the conductance of M12 and M13 is approximately four times greater than M14 and M15.

Therefore, $V_{DDH}$ is approximately −2.5 volts, and $V_{DDL}$ is approximately −3.5 volts.

The dynamic, internally generated voltages at nodes X and Y are thus set at a potential which enhances the switching speed of output transistors M10 and M11 respectively. With node X being pulled up to $V_{DDH}$, the reference voltage applied to the gate of M10 is larger than the potential of the static $V_{ref}$. As a result, with node A at a low potential, transistor M10 is biased to switch or turn off faster.

Similarly, with node Y pulled down to $V_{DDL}$, the reference voltage applied to the gate of M11 is smaller than the potential of the static $V_{ref}$. With node B at a high potential, transistor M11 is biased to switch or turn on faster. As a result, nodes [$V_{out}$] and T are pulled up and a large amount of current flows to node T.

Inverters 72 and 74 of refresh circuit 70 are controlled by the output states of transistors M10 and M11 respectively. The inverters 72 and 74 are used to regeneratively drive and maintain nodes $V_{out}$ and [$V_{out}$] in their respective complementary states as determined by transistors M10 and M11.

With the gates of transistors M18 and M19 coupled to node T, transistor M19 is turned on and transistor M18 is turned off, thus aiding transistor M10 in pulling down $V_{out}$ and node R to ($V_{ss}=-4.5$ volts). As node R is pulled down to ground, it regeneratively drives the gate of transistor M16, turning on transistor M16. With transistor M16 turned on, it aids transistor M11 in pulling up [$V_{out}$] and node T to the high CMOS level ($V_{cc}=0.0$ volts). Accordingly, inverters 72 and 74 tend to regeneratively refresh Vout and [Vout] at nodes R and T respectively.

Alternatively, in the event the potential at node A is high and the potential at node B is low transistors M10 through M19 operate in the complement to that described above. Therefore, $V_{out}$ is pulled up to $V_{cc}$ and [$V_{out}$] is pulled down to $V_{ss}$.

The average translation time of the present invention is in the range of 600 to 700 picoseconds, which represents a speed improvement over the prior art translators.

In an alternative embodiment of the present invention, a diode D1 may be coupled between the drain of transistor M11 and [$V_{out}$], and a second diode D2 may be coupled between the drain of transistor M10 and $V_{out}$. The diodes D1 and D2 eliminate stray current from flowing from refresh circuit 70, through transistors M10 and M11 which are bi-directional, to and back into the transistors of input translation circuit 60 between the circuit 70 and respective output nodes $V_{out}$ and [$V_{out}$].

Figure 5:
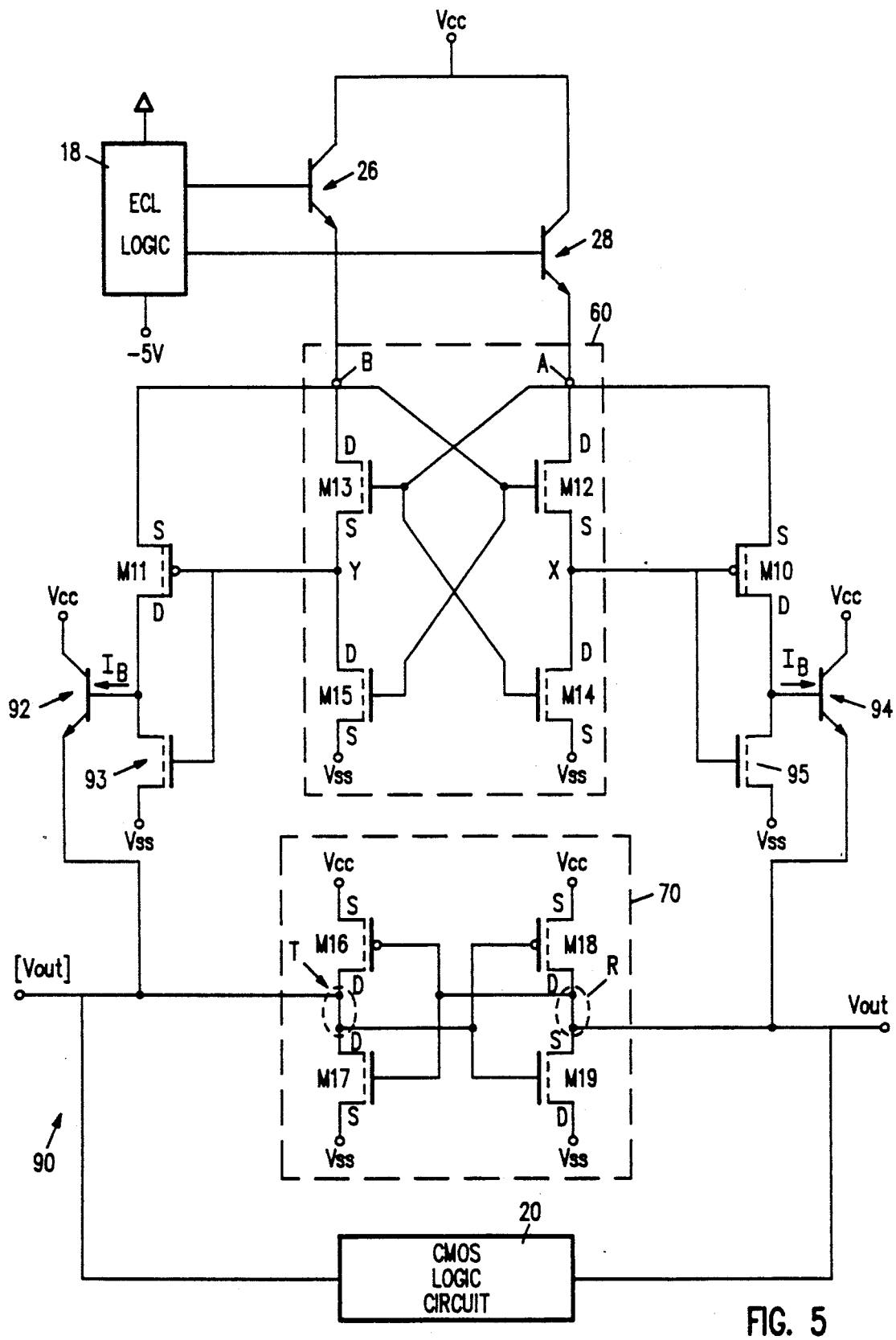
FIG. 5 is an alternative embodiment of an ECL to CMOS translation circuit according to the present invention.

Referring to FIG. 5, an alternative embodiment of the ECL to CMOS translation circuit according to the present invention is shown. The circuit 90 includes a bipolar transistor 92, an n channel transistor 93, a second bipolar transistor 94 and an n-channel transistor 95. The circuit components which perform the same or a similar function as described with reference to FIG. 3 are indicated by the same reference numerals in FIG. 5.

The base of the bipolar transistor 92 is coupled to the drain (D) of transistor M11, the collector is coupled to $V_{cc}$, and the emitter is coupled to node T. The channel of transistor 93 is coupled between the drain (D) if transistor M11 and $V_{ss}$, and the gate is coupled to node X. The base of bipolar transistor 94 is coupled to the drain of bipolar transistor M10, the collector is coupled to $V_{cc}$, and the emitter is coupled to node R. The channel of transistor 95 is coupled between the drain of transistor M10 and $V_{SS}$, and the gate is coupled to node X.

The ECL to CMOS inverter embodiment of FIG. 5 provides a reduction in the overall space layout of the circuit in spite of the addition of transistors 92 through 95. During operation, the high current gain of the bipolar transistors 92 is sufficient to drive node T in the same manner as described above. Since only a minimal base current ($I_B$) is required to drive transistor 92, the size of transistor M11 can be significantly reduced. N-channel transistor 93 provides a discharge path between the base of transistor 92 and $V_{SS}$. Transistors 94 and 95 operate in the same manner as transistors 92 and 93 as described above. In a preferred embodiment, transistors M10 and M11 have a channel length of 0.8 microns and a width of 1.2 microns, which is significantly smaller than the transistors M10 and M11 as described with respect to the embodiment of FIG. 3.

Other embodiments of the invention will be apparent to those skilled in the art from a consideration of this specification or practice of the invention disclosed herein. For example, the translation circuit of the present invention may be used to translate signals from any logic type operating within a first potential range to a second type of logic operating at a second potential range. Also, the sizes of the transistors may be varied to adjust $V_{DDH}$ and $V_{DDL}$ to desired potentials. It is intended that the specification and examples be considered as exemplary only, with the true scope and spirit of the invention being indicated by the following claims.

What is claimed is:

1. A translator for translating signals operating within a first predetermined logic level range to a second predetermined logic level range, the translator comprising:
   receiving means for receiving signals operating within the first predetermined logic level range, the receiving means including a first bipolar transistor arranged in a first emitter-follower configuration for receiving a first input signal and a second bipolar transistor, complementary to said first bipolar transistor, arranged in a second emitter-follower configuration for receiving a second input signal complementary to said first input signal;
   generation means internal to said translator for generating a dynamic reference signal;
   translation means, coupled to said receiving means and said generation means, for translating said signals within the first predetermined logic level range to the second predetermined logic level range, said translation means operating on said internal reference signal, said translation means including first and third MOS transistors having their respective gates coupled to the emitter of said first bipolar transistor, and second and fourth MOS transistors having their respective gates coupled to the emitter of said second bipolar transistor; and
   output means, coupled to said translation means, for outputting said translated signals.

2. The translator of claim 1, wherein said output means includes:
   a first output transistor coupled to said translation means; and
   a second output transistor coupled to said translation means.

3. The translator of claim 1, further comprising a refresh circuit connected to said output means for regeneratively driving said output means.

4. A translator for translating signals operating within a first predetermined logic level range to a second predetermined logic level range, the translator comprising:
   receiving means for receiving signals operating within the first predetermined logic level range;
   generation means internal to said translator for generating a dynamic reference signal;
   translation means, coupled to said receiving means and said generation means, for translating said signals with the first predetermined logic level range to the second predetermined logic level range, said translation means operating on said internal reference signal;
   output means, coupled to said translation means, for outputting said translated signals; and
   refresh means connected to said output means for regeneratively driving said output means.

5. The translator of claim 4, wherein the output means includes first and second output transistors coupled to said translation means.

6. The translator of claim 5, wherein the refresh means comprises first and second CMOS inverters coupled between the first and second output transistors.

7. The translator of claim 4, wherein said receiving means includes a first bipolar transistor arranged in a first emitter-follower configuration for receiving a first input signal and a second bipolar transistor, complementary to said first bipolar transistor, arranged in a second emitter-follower configuration for receiving a second input signal complementary to said first input signal.

8. The translator of claim 7, wherein the translation means includes
   first and third MOS transistors having their respective gates coupled to the emitter of said first bipolar transistor; and
   second and forth MOS transistors having their respective gates coupled to the emitter of said second bipolar transistor.

9. The translator of claim 4, wherein the generator means includes dynamic reference voltage means, coupled to said translator means, for providing a first dynamic reference voltage and a second dynamic reference voltage to said translator means;
   wherein said first reference voltage switched between a first potential and a second potential as one of the complementary input signals switches from the high to low state and said second reference voltage switches between said second and first potential as the second input signal switches from the low to high state.

10. The translator of claim 9, wherein said first and second potentials are discrete potentials within the operating range of the second logic level.

* * * * *